(12) United States Patent
Qin et al.

(10) Patent No.: US 10,276,753 B2
(45) Date of Patent: Apr. 30, 2019

(54) LED FLIP-CHIP PACKAGE SUBSTRATE AND LED PACKAGE STRUCTURE

(71) Applicant: KAISTAR Lighting (Xiamen) Co., Ltd, Xiamen (CN)

(72) Inventors: Guoheng Qin, Xiamen (CN); Steve Meng-Yuan Hong, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 15/617,359

(22) Filed: Jun. 8, 2017

(65) Prior Publication Data

US 2018/0062048 A1    Mar. 1, 2018

(30) Foreign Application Priority Data

Aug. 30, 2016   (CN) .......................... 2016 1 0771112

(51) Int. Cl.
*H01L 33/02*    (2010.01)
*H01L 33/36*    (2010.01)
(Continued)

(52) U.S. Cl.
CPC ............ *H01L 33/486* (2013.01); *H01L 33/60* (2013.01); *H01L 33/62* (2013.01); *H01L 33/641* (2013.01)

(58) Field of Classification Search
CPC ...... H01L 33/36–33/387; H01L 33/405; H01L 33/42; H01L 33/483; H01L 33/486;
(Continued)

(56) References Cited

U.S. PATENT DOCUMENTS 3,335,336 A  *  8/1967  Koichi .................. H01L 23/057
                                                      174/521
3,971,869 A  *  7/1976  Gelber .............. G02F 1/133502
                                                      428/195.1
(Continued)

FOREIGN PATENT DOCUMENTS

CN          101930932 A       12/2010
CN          102447040 A        5/2012
(Continued)

*Primary Examiner* — Natalia A Gondarenko
(74) *Attorney, Agent, or Firm* — Hemisphere Law, PLLC; Zhigang Ma

(57) ABSTRACT

A LED flip-chip package substrate includes a ceramic base (e.g., aluminum nitride base), a conductive wire layer disposed on the ceramic base and having pads in pairs, an insulating protective layer (e.g., low-temperature glass glaze layer) disposed on a same side of the ceramic base as the conductive wire layer and exposing the pads, and a metallic reflective layer (e.g., aluminum layer) disposed on a side of the insulating protective layer facing away from the ceramic base and exposing the pads. Moreover, a LED package structure adopting the LED flip-chip package substrate and other LED package structures with similar material layers such as a chip-level packaged LED package structure are provided. By comprehensively utilizing advantages of various materials, the LED flip-chip package substrate with high heat conductivity, high reflectivity, high stability and superior insulation and the LED package structure with high reliability and even high light extraction efficiency are obtained.

14 Claims, 8 Drawing Sheets

(51) Int. Cl.
*H01L 33/60* (2010.01)
*H01L 33/62* (2010.01)
*H01L 33/48* (2010.01)
H01L 33/44 (2010.01)
H01L 33/52 (2010.01)
H01L 33/64 (2010.01)

(58) Field of Classification Search
CPC ........ H01L 33/48–33/648; H01L 33/52; H01L 33/62; H01L 33/641; H01L 33/60; H01L 23/04–23/08; H01L 23/12; H01L 23/15; H01L 23/3731; H01L 23/49503–23/49513; H01L 23/49582; H01L 23/49833; H01L 23/49838; H01L 25/115; H01L 25/165; H01L 25/167; H01L 2933/0033; H01L 2933/005; H01L 2933/0066–2933/0091; H01L 2224/40237; H01L 2224/40257; H01L 2224/48237; H01L 2224/48257; H01L 33/08; H01L 33/44
USPC ......... 257/88, 98, 99, 89, E33.068, E33.072, 257/E33.001, E33.06; 438/27, 29; 359/586, 585
See application file for complete search history.

(56) References Cited

U.S. PATENT DOCUMENTS

| | | | |
|---|---|---|---|
| 2004/0084682 A1* | 5/2004 | Illek | H01L 33/0079 257/80 |
| 2009/0001399 A1* | 1/2009 | Diana | H01L 33/507 257/98 |
| 2010/0148198 A1* | 6/2010 | Sugizaki | H01L 33/44 257/98 |
| 2010/0219430 A1* | 9/2010 | Wu | H01L 33/54 257/91 |
| 2010/0308357 A1* | 12/2010 | Horie | H01L 33/44 257/98 |
| 2010/0327294 A1* | 12/2010 | Chung | H01L 25/0753 257/88 |
| 2012/0037944 A1* | 2/2012 | Takine | H01L 33/58 257/98 |
| 2012/0126276 A1* | 5/2012 | Hori | H01L 33/405 257/98 |
| 2013/0056782 A1* | 3/2013 | Eberhardt | C03C 3/17 257/98 |
| 2013/0069091 A1* | 3/2013 | Wang | H01L 33/58 257/98 |
| 2013/0341666 A1* | 12/2013 | Yoshida | H01L 33/501 257/98 |
| 2014/0124812 A1* | 5/2014 | Kuramoto | H01L 33/54 257/98 |
| 2014/0203728 A1* | 7/2014 | Yang | H01L 33/60 315/294 |
| 2014/0291706 A1* | 10/2014 | Lin | H01L 33/52 257/88 |
| 2015/0221623 A1* | 8/2015 | Tischler | H01L 25/165 257/89 |
| 2015/0273796 A1* | 10/2015 | Rule | C09J 5/06 156/85 |
| 2015/0280078 A1* | 10/2015 | Yen | H01L 33/505 257/13 |
| 2015/0333227 A1 | 11/2015 | Lee et al. | |
| 2016/0005941 A1* | 1/2016 | Tsai | H01L 33/382 257/98 |

FOREIGN PATENT DOCUMENTS

| | | |
|---|---|---|
| CN | 102884645 A | 1/2013 |
| CN | 105006508 A | 10/2015 |
| CN | 105047793 A | 11/2015 |
| JP | 2011-258665 A | 12/2011 |
| TW | 201218453 | 5/2012 |
| TW | 201547056 | 12/2015 |

* cited by examiner

LED FLIP-CHIP PACKAGE SUBSTRATE AND LED PACKAGE STRUCTURE

TECHNICAL FIELD

The disclosure relates to a LED packaging technical field, and more particularly to a LED flip-chip package substrate and a LED package structure.

DESCRIPTION OF RELATED ART

With the continuous development of the flip-chip technology, advantages of chips of flip-chip structure will be showed thoroughly. No matter in the field of visible light or invisible light, the flip-chip technology will be one of main applications in the next generation of light source. Various properties of materials adopted by leadframes or packaging substrates related to the flip-chip technology at present such as heat conductivity, electrical insulation, stability and reflectivity are mutually contradicted. For instance, a mirror aluminum material has high heat conductivity, reflectivity and stability, but electrical insulation thereof is poor; a ceramic material has high heat conductivity, stability and superior electrical insulation, but the reflectivity is relatively low, especially the reflectivity in the ultraviolet wave band is low; a polymer material such as epoxy molding compound (EMC)/silicone molding compound (SMC) has high reflectivity, but heat conductivity, electrical insulation and stability are comparatively poor, especially the stability in the ultraviolet wave band is inferior. Therefore, how to solve the contradiction of the various properties of the conventional materials adopted by the LED flip-chip leadframes or the packaging substrates is an encountered issue.

SUMMARY

Accordingly, in order to overcome the drawback and shortcoming in the prior art, the disclosure provides a LED flip-chip package substrate and a LED package structure.

Specifically, a LED flip-chip package substrate provided by an embodiment of the disclosure includes a ceramic base, a conductive wire layer, an insulating protective layer and a metallic reflective layer. The conductive wire layer is disposed on the ceramic base. The conductive wire layer includes pads disposed in pairs. The insulating protective layer is disposed on a same side of the ceramic base as the conductive wire layer and exposing the pads. The metallic reflective layer is disposed on a side of the insulating protective layer facing away from the ceramic base and exposing the pads.

In an embodiment of the disclosure, the insulating protective layer is a bismaleimide-triazine material layer and/or a low-temperature glass glaze layer. A melting point of the low-temperature glass glaze layer is lower than 600° C.

In an embodiment of the disclosure, the reflectivity of the metallic reflective layer in a wave band from deep ultraviolet to infrared is more than 95%.

In an embodiment of the disclosure, the LED flip-chip package substrate further includes an optical anti-reflective film disposed on a side of the metallic reflective layer facing away from the insulating protective layer and exposing the pads.

In an embodiment of the disclosure, a material of the optical anti-reflective film includes magnesium fluoride and/or silicon dioxide, and the optical anti-reflective film is a monolayer structure or a multilayer structure.

In an embodiment of the disclosure, the LED flip-chip package substrate further includes a reflective cup with a bowl-like structure disposed on a side of the insulating protective layer facing away from the ceramic base and surrounding the pads and further exposing the pads. The metallic reflective layer is on a side of the insulating protective layer facing away from the ceramic base and an inner surface of the reflective cup.

In an embodiment of the disclosure, the number of the reflective cup is at least one, and the number of the pads surrounded by each reflective cup is at least one pair. The insulating protective layer and the metallic reflective layer are partially disposed on the conductive wire layer.

Furthermore, an embodiment of the disclosure further provides a LED package structure, including any one of the LED flip-chip package substrates described above, a LED chip and a light-transmissive encapsulation. The LED chip and the pads of the LED flip-chip package substrate are fixed by soldering for electrical connection. The light-transmissive encapsulation is disposed to cover the LED chip.

Furthermore, an embodiment of the disclosure further provides a LED package structure, including a quartz glass base, a light-transmissive layer, a LED chip, an optical anti-reflective film and a reflective layer. The light-transmissive layer is disposed on a side of the quartz glass base. The LED chip is disposed on a side of the light-transmissive layer facing away from the quartz glass base. The quartz glass base and the light-transmissive layer are located on a front surface of the LED chip, and a rear surface of the LED chip is formed with pads disposed in pairs. The optical anti-reflective film is disposed on a side surface of the LED chip, a surface of the light-transmissive layer uncovered by the LED chip and a surface of the quartz glass base uncovered by the LED chip. The reflective layer is disposed on a side of the optical anti-reflective film facing away from the quartz glass base.

In an embodiment of the disclosure, the LED package structure further includes a protective layer disposed on a side of the reflective layer facing away from the optical anti-reflective film.

In an embodiment of the disclosure, a material of the light-transmissive layer is glass with a melting point lower than 600° C. or modified silicone resin. A material of the optical anti-reflective film is magnesium fluoride and/or silicon dioxide, and the reflective layer is a metal aluminum layer.

In conclusion, the embodiments of the disclosure can obtain the LED flip-chip package substrate with high heat conductivity, high reflectivity, high stability and superior insulation as well as the LED package structure with high reliability, and even high light extraction efficiency by comprehensively utilizing advantages of various materials.

By the following detailed description with reference to accompanying drawings, other aspects and features of the disclosure will become apparent. However, it should be understood that, the drawings only are for the purpose of explanation and not as limiting the scope of the disclosure. It also be appreciated that, unless otherwise indicated, the drawings are not necessarily drawn to scale, they are merely trying to conceptually illustrate the structures and procedures described herein.

BRIEF DESCRIPTION OF THE DRAWINGS

In the following, with reference to accompanying drawings, concrete embodiments of the disclosure will be described in detail.

DETAILED DESCRIPTION OF PREFERRED EMBODIMENTS

Embodiments of the disclosure will be described in detail with reference to the accompanying drawings as follows to better understand the previously mentioned objectives, features and advantages of the disclosure.

First Embodiment

Figure 1:
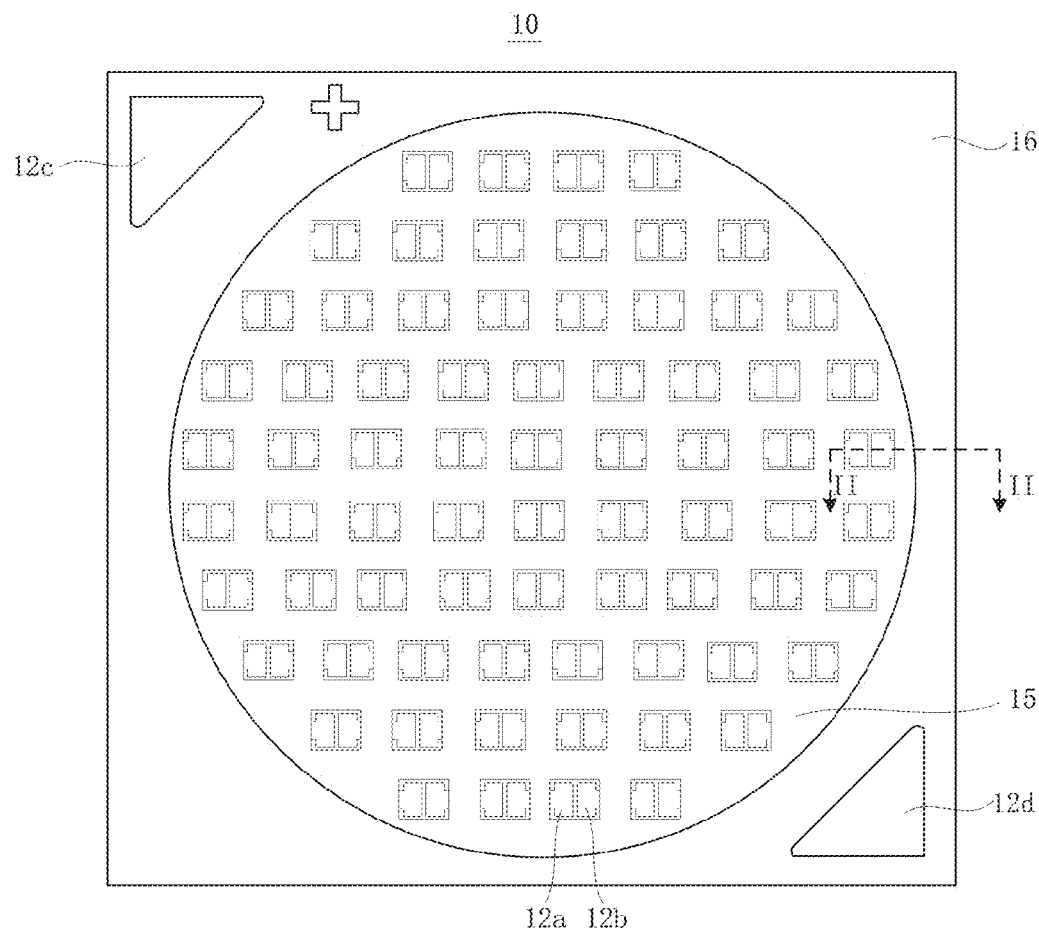
FIG. 1 is a top schematic view of a LED flip-chip package substrate according to a first embodiment of the disclosure.
Figure 2:
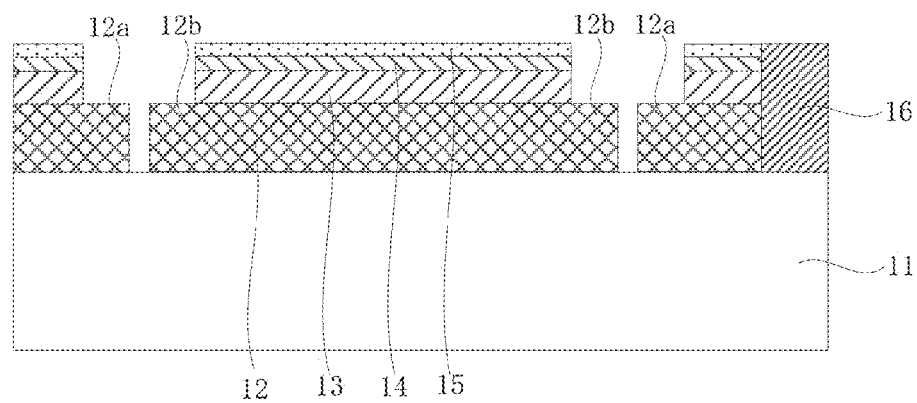
FIG. 2 is an enlarged local schematic view of a cross-sectional structure of the LED flip-chip package substrate shown in FIG. 1 taken along a line of II-II.

Referring to FIG. 1 and FIG. 2, FIG. 1 is a top schematic view of a LED flip-chip package substrate according to a first embodiment of the disclosure. FIG. 2 is an enlarged local schematic view of a cross-sectional structure of the LED flip-chip package substrate shown in FIG. 1 taken along a line of II-II. A LED flip-chip package substrate 10 of the embodiment includes a ceramic base 11, a conductive wire layer 12, an insulating protective layer 13, a metallic reflective layer 14, an optical anti-reflective film 15 and an ink layer 16.

The ceramic base 11 is preferably an aluminum nitride (AlN) ceramic base. The AlN ceramic base has high heat conductivity (200 W/m·K), superior insulation (volume resistivity>$10^{13}$ Ω·cm) as well as high chemical and thermal stability. The conductive wire layer 12 is disposed on the ceramic base 11. The conductive wire layer 12 includes multiple (i.e., more than one) pairs of pads 12a and 12b, and a positive electrode 12c and a negative electrode 12d disposed in pair. The pairs of pads 12a and 12b are respectively configured to electrically connect with the positive electrode and the negative electrode of several LED flip chips by soldering. The positive electrode 12c and the negative electrode 12d are connected with respective pads 12a and 12b for the external power source to supply electricity to the pads 12a and 12b. Moreover, the conductive wire layer 12 is for example produced by a thick film process or a thin film process, which can be a silver (Ag) layer produced by the thick film process (e.g., sintering), or a copper (Cu)/nickel (Ni)/aurum (Au) multilayer structure produced by the thin film process (e.g., evaporation or sputtering). The insulating protective layer 13 is disposed on an upper surface of the conductive wire layer 12 (i.e., a surface on a side of the conductive wire layer 12 facing away from the ceramic base 11) and exposing the pairs of pads 12a and 12b of the conductive wire layer 12. The insulating protective layer 13 is disposed around the pads 12a and 12b on the ceramic base 11. As a protective layer with superior insulation and stability, the insulating protective layer 13 can be produced by a printing process. A material of the insulating protective layer 13 is preferably a low-temperature glass glaze. Specifically, the low-temperature glass glaze is a glass series melt under 600° C., typically in a range of 400° C.-600° C. (which even can be under 400° C. according to the development trend of the material), containing some of $SiO_2$, $B_2O_3$, $Bi_2O_3$, ZnO, $Li_2O$, $K_2O$, $Na_2O$, CaO and BaO or even other ingredients, which has properties of superior insulation, chemical and thermal stability of conventional glass. The low-temperature glass glaze is melt at relatively low temperature due to a low melting point. Glass liquid is formed to wet a surface of a protected object. A dense stable insulating protective layer is formed on the surface of the protected object after cooling. Other subjects can be cemented densely and securely by viscosity of the glass liquid. It deserves to be mentioned that the insulating protective layer 13 can be other materials with superior insulation, thermal stability, chemical stability, adhesive property, strong adhesion and good air-tightness besides the low-temperature glass glaze, such as a BT series material. The BT series material is bismaleimide triazine, which is also a combination of bismaleimide and cyanate ester resin.

The metallic reflective layer 14 is disposed on a surface of the insulating protective layer 13 facing away from the conductive wire layer 12, which can be formed on the surface of the insulating protective layer 13 by evaporation or sputtering. Preferably, the metallic reflective layer 14 is an aluminum (Al) layer. The metal Al has high reflectivity in the wave band from deep ultraviolet to infrared, typically more than 95%, which can achieve a high reflecting effect in all the wave band. The optical anti-reflective film 15 is for example formed on a surface of the metallic reflective layer 14 facing away from the insulating protective layer 13 by a process such as evaporation or sputtering, the material of which is preferably magnesium fluoride ($MgF_2$). The $MgF_2$ crystal has extremely outstanding transmittance in the whole range from deep ultraviolet to far infrared, as well as excellent thermal stability and chemical stability, which can form a dense stable protective layer on the surface of the metallic reflective layer 14 and increase permeability of reflected rays from the surface of the metallic reflective layer 14 for improving the extraction efficiency of light in a light-transmissive encapsulation. Besides $MgF_2$, the optical anti-reflective film 15 can be other materials with superior transmittance (≥90%), thermal stability and chemical stability in the entire wave band from deep ultraviolet to far infrared, such as $SiO_2$. The optical anti-reflective film 15 can be either a monolayer structure or a multilayer structure. The thickness of the mono-layered optical anti-reflective film is ¼ of a wavelength of the corresponding wave band (λ/4). If it is a multilayered optical anti-reflective film, thicknesses of the layers are a combination of ¼ and ½ of the wavelength of the corresponding wave band. A manner of combination is determined by the number of layers and the material of the film. The ink layer 16 is disposed on the ceramic base 11, specifically out of a die bonding region of the ceramic base 11 (i.e., the circular region in FIG. 1) in the embodiment. Each pair of pads 12a, 12b, the insulating protective layer 13, the metallic reflective layer 14 and the optical anti-reflective film 15 described above are formed in the circular die bonding region shown in FIG. 1. Moreover, it can be seen from FIG. 1 and FIG. 2 that the ink layer 16 is disposed around the positive electrode 12c and the negative electrode 12d out of the die bonding region of the conductive wire layer 12. The ink layer 16 is further disposed around the die bonding region.

Second Embodiment

Figure 3:
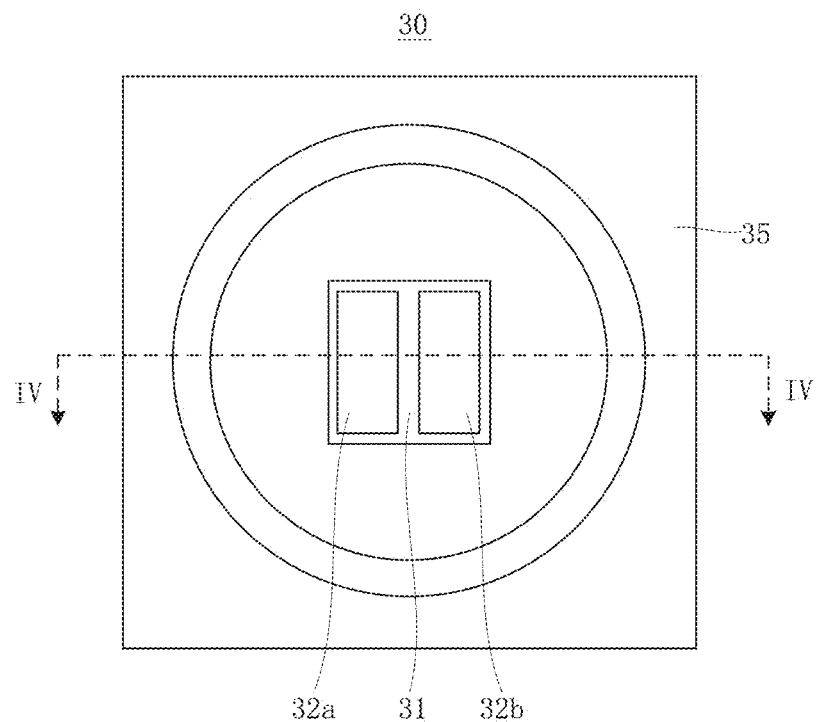
FIG. 3 is a top schematic view of a LED flip-chip package substrate according to a second embodiment of the disclosure.
Figure 4:
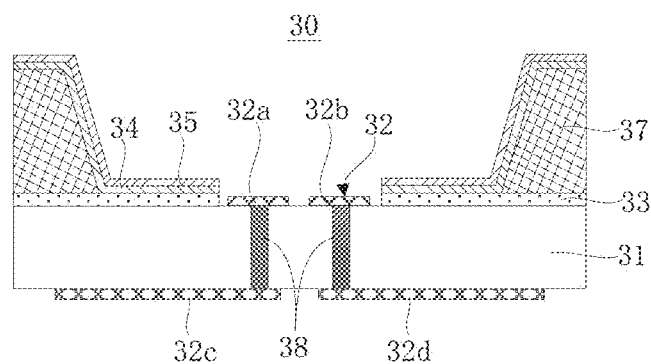
FIG. 4 is a cross-sectional schematic view of the LED flip-chip package substrate shown in FIG. 3 taken along a line of IV-IV.

Referring to FIG. 3 and FIG. 4, FIG. 3 is a top schematic view of a LED flip-chip package substrate according to a second embodiment of the disclosure. FIG. 4 is a cross-sectional schematic view of the LED flip-chip package substrate shown in FIG. 3 taken along a line of IV-IV. The LED flip-chip package substrate 30 of the embodiment includes a ceramic base 31, a conductive wire layer 32, an insulating protective layer 33, a metallic reflective layer 34, an optical anti-reflective film 35 and a reflective cup 37.

The ceramic base 31 is preferably an aluminum nitride (AlN) ceramic base. The AlN ceramic base has high heat conductivity (200 W/m·K), superior insulation (volume resistivity>$10^{13}$ Ω·cm) as well as chemical and thermal stability. The conductive wire layer 32 is formed on the ceramic base 31 by for example a thick film process or a thin film process, which can be a silver (Ag) layer produced by the thick film process (e.g., sintering), or a copper (Cu)/nickel (Ni)/aurum (Au) multilayer structure produced by the thin film process (e.g., evaporation or sputtering). Moreover, the conductive wire layer 32 includes a pair of pads 32a and 32b, and a positive electrode 32c and a negative electrode 32d disposed in pair. The pads 32a and 32b are respectively configured to electrically connect with the positive electrode and the negative electrode of a LED flip chip by soldering. The positive electrode 32c and the negative electrode 32d are disposed on the bottom of the ceramic base 31, and electrically connected with the pads 32a and 32b by a via filled conductor 38 through the ceramic base 31. A material of the via filled conductor 38 is for example silver (Ag), copper (Cu), etc. The insulating protective layer 33 is formed on an upper surface of the ceramic base 31 around the pads 32a and 32b to expose the pads 32a and 32b. The insulating protective layer 33 is disposed parallel (without superposition) with the conductive wire layer 32 in FIG. 4 on the upper surface of the ceramic base 31. Obviously, the insulating protective layer 33 can likewise cover parts of the pads 32a and 32b, which will not interfere with electrical connection of the pads 32a, 32b and the electrode of the LED flip chip by soldering subsequently. Moreover, the material of the insulating protective layer 33 is for example low-temperature glass glaze or the BT material. A melting point of the low-temperature glass glaze is under 600° C., typically in a range of 400° C.-600° C., which can possibly be under 400° C. according to the development trend of the material. The reflective cup 37 is disposed on a surface of a side of the insulating protective layer 33 facing away from the ceramic base 31. The reflective cup 37 is a bowl-like structure that surrounds the pads 32a and 32b to expose the pads 32a and 32b. The reflective cup 37 typically adopts materials with thermal stability, such as ceramic material aluminum oxide ($Al_2O_3$). Moreover, the reflective cup 37 can be firmly combined with the ceramic base 31 by adhesion of the insulating protective layer 33. The metallic reflective layer 34 is formed on a surface of a side of the insulating protective layer 33 facing away from the ceramic base 31, as well as an inner surface and a top surface of the reflective cup 37, which can be produced by evaporation or sputtering. The metallic reflective layer 34 is preferably an aluminum layer, because the metal aluminum has quite high reflectivity in the wave band from deep ultraviolet to infra-red, generally over 95%, which can achieve a high reflection effect on all the wave band. The optical anti-reflective film 35 is disposed on a surface of a side of the metallic reflective layer 34 facing away from the insulating protective layer 33, which is for example formed on the surface of the metallic reflective layer 34 by a process such as evaporation or sputtering, the material of which can be magnesium fluoride, silicon dioxide, etc. The optical anti-reflective film 35 can be a monolayer structure or a multilayer structure. Moreover, it deserves to be mentioned that the metallic reflective layer 34 and the optical anti-reflective film 35 can be merely disposed on an inclined inner surface of the reflective cup 37 rather than both on the top surface and the inner surface.

Third Embodiment

Figure 5:
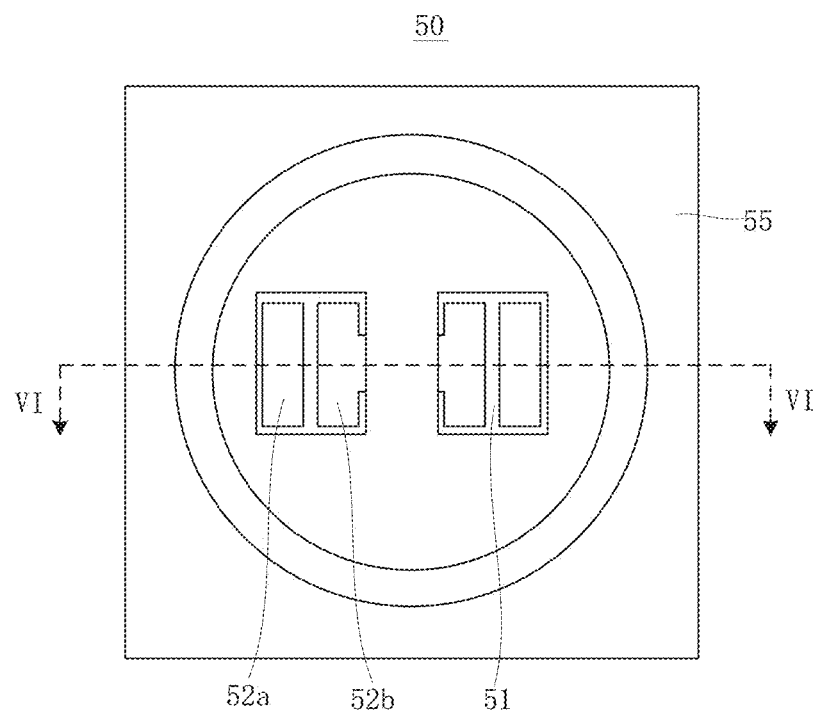
FIG. 5 is a top schematic view of a LED flip-chip package substrate according to a third embodiment of the disclosure.
Figure 6:
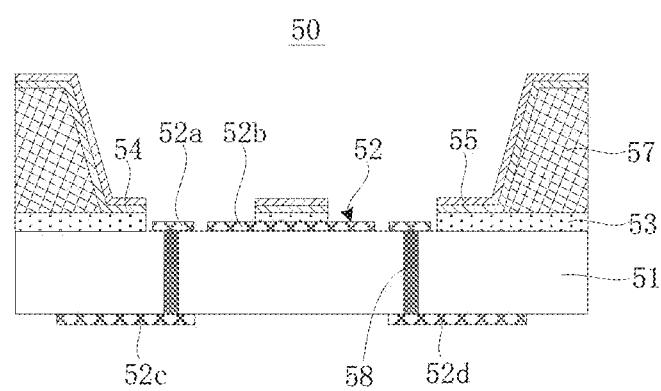
FIG. 6 is a cross-sectional schematic view of the LED flip-chip package substrate shown in FIG. 5 taken along a line of VI-VI.

Referring to FIG. 5 and FIG. 6, FIG. 5 is a top schematic view of a LED flip-chip package substrate according to a third embodiment of the disclosure. FIG. 6 is a cross-sectional schematic view of the LED flip-chip package substrate shown in FIG. 5 taken along a line of VI-VI. The LED flip-chip package substrate 50 of the embodiment includes a ceramic base 51, a conductive wire layer 52, an insulating protective layer 53, a metallic reflective layer 54, an optical anti-reflective film 55 and a reflective cup 57.

The ceramic base 51 is preferably the aluminum nitride (AlN) ceramic base. The AlN ceramic base has high heat conductivity (200 W/m·K), superior insulation (volume resistivity>$10^{13}$ Ω·cm) as well as chemical and thermal stability. The conductive wire layer 52 is formed on the ceramic base 51 by for example a thick film process or a thin film process, which can be a silver (Ag) layer produced by the thick film process (e.g., sintering), or a copper (Cu)/nickel (Ni)/aurum (Au) multilayer structure produced by the thin film process (e.g., evaporation or sputtering). Moreover, the conductive wire layer 52 includes multiple pairs of pads 52a and 52b, and a positive electrode 52c and a negative electrode 52d disposed in pair. The pads 52a and 52b are respectively configured to electrically connect with the positive electrode and the negative electrode of several LED flip chips by soldering. The positive electrode 52c and the negative electrode 52d are disposed on the bottom of the ceramic base 51, and electrically connected with the pads 52a and 52b by a via filled conductor 58 through the ceramic base 51. The material of the via filled conductor 58 is for example silver (Ag), copper (Cu), etc. The insulating protective layer 53 is formed on an upper surface of the ceramic base 51 and a surface of a side of the conductive wire layer 52 facing away from the ceramic base 51, encompassing the pads 52a and 52b to expose the pads 52a and 52b. The material of the insulating protective layer 53 is for example low-temperature glass glaze or the BT material. A melting point of the low-temperature glass glaze is under 600° C.

typically in a range of 400° C.-600° C., which can possibly be under 400° C. according to the development trend of the material. The reflective cup 57 is disposed on a surface of a side of the insulating protective layer 53 facing away from the ceramic base 51. The reflective cup 57 is a bowl-like structure that encompasses the pads 52a and 52b to expose the pads 52a and 52b. The reflective cup 57 typically adopts materials with thermal stability, such as the ceramic material aluminum oxide ($Al_2O_3$). Moreover, the reflective cup 57 can be firmly combined with the ceramic base 51 by adhesion of the insulating protective layer 53. The metallic reflective layer 54 is formed on a surface of a side of the insulating protective layer 53 facing away from the ceramic base 51, as well as an inner surface and a top surface of the reflective cup 57, which can be produced by evaporation or sputtering. The metallic reflective layer 54 is preferably an aluminum layer, because the metal aluminum has quite high reflectivity in the wave band from deep ultraviolet to infrared, generally over 95%, which can achieve a high reflection effect on all of the wave band. The optical anti-reflective film 55 is disposed on a surface of a side of the metallic reflective layer 54 facing away from the insulating protective layer 53 and the reflective cup 57, which is for example formed on the surface of the metallic reflective layer 54 by a process such as evaporation or sputtering, the material of which can be magnesium fluoride, silicon dioxide, etc. The optical anti-reflective film 55 can be a monolayer structure or a multilayer structure. Moreover, it deserves to be mentioned that the metallic reflective layer 54 and the optical anti-reflective film 55 can be merely disposed on an inclined inner surface of the reflective cup 57 rather than both on the top surface and the inner surface.

Fourth Embodiment

Figure 7:
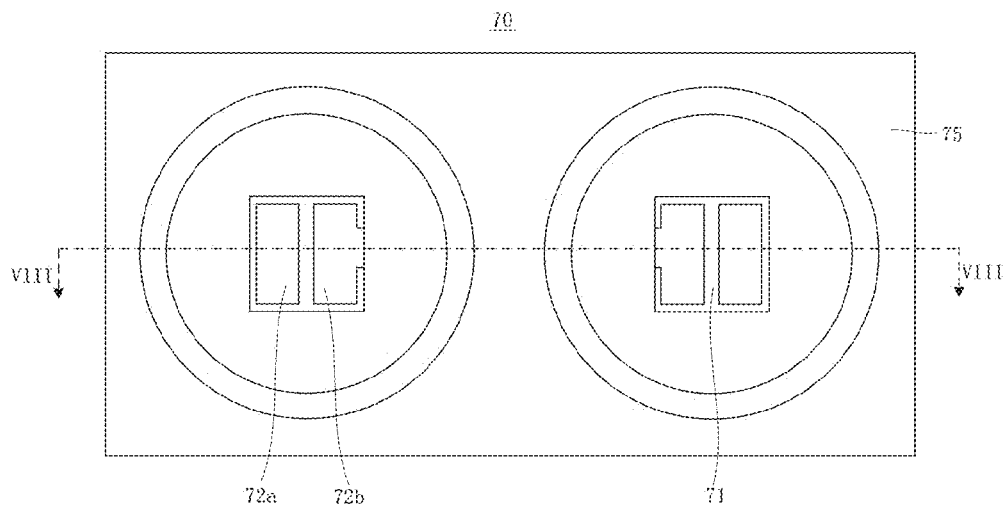
FIG. 7 is a top schematic view of a LED flip-chip package substrate according to a fourth embodiment of the disclosure.
Figure 8:
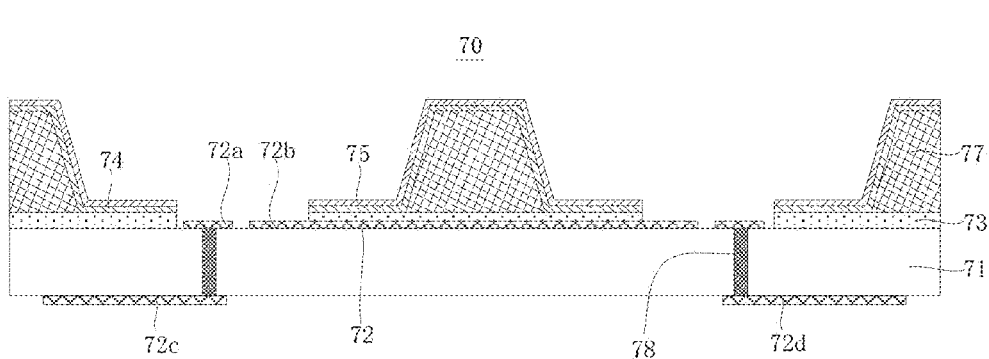
FIG. 8 is a cross-sectional schematic view of the LED flip-chip package substrate shown in FIG. 7 taken along a line of VIII-VIII.

Referring to FIG. 7 and FIG. 8, FIG. 7 is a top schematic view of a LED flip-chip package substrate according to a fourth embodiment of the disclosure. FIG. 8 is a cross-sectional schematic view of the LED flip-chip package substrate shown in FIG. 7 taken along a line of VIII-VIII. The LED flip-chip package substrate 70 of the embodiment includes a ceramic base 71, a conductive wire layer 72, an insulating protective layer 73, a metallic reflective layer 74, an optical anti-reflective film 75 and a reflective cup 77.

The ceramic base 71 is preferably the aluminum nitride (AlN) ceramic base. The AlN ceramic base has high heat conductivity (200 W/m·K), superior insulation (volume resistivity>$10^{13}$ Ω·cm) as well as chemical and thermal stability. The conductive wire layer 72 is formed on the ceramic base 71 by for example a thick film process or a thin film process, which can be a silver (Ag) layer produced by the thick film process (e.g., sintering), or a copper (Cu)/nickel (Ni)/aurum (Au) multilayer structure produced by the thin film process (e.g., evaporation or sputtering). Moreover, the conductive wire layer 72 includes multiple pairs (FIG. 7 and FIG. 8 show two pairs as an example) of pads 72a and 72b, and a positive electrode 72c and a negative electrode 72d disposed in pair. The pads 72a and 72b are respectively configured to electrically connect with the positive electrode and the negative electrode of the LED flip chips by soldering. The positive electrode 72c and the negative electrode 72d are disposed on the bottom of the ceramic base 71, and electrically connected with the pads 72a and 72b by a via filled conductor 78 through the ceramic base 71. A material of the via filled conductor 78 is for example silver (Ag), copper (Cu), etc. The insulating protective layer 73 is formed on an upper surface of the ceramic base 71 and a surface of a side of the conductive wire layer 72 facing away from the ceramic base 71, encompassing the pads 72a and 72b to expose the pads 72a and 72b. A material of the insulating protective layer 73 is for example low-temperature glass glaze or the BT material. A melting point of the low-temperature glass glaze is under 600° C., typically in a range of 400° C.-600° C., which can possibly be under 400° C. according to the development trend of the material. The reflective cup 77 is disposed on a surface of a side of the insulating protective layer 73 facing away from the ceramic base 71. The reflective cup 77 is a bowl-like structure. Two reflective cups 77 are shown in FIG. 7 and FIG. 8, which respectively encompass a pair of pads 72a and 72b. It can be understood that each of the reflective cups can also encompass the pairs of pads in other embodiments. The reflective cup 77 typically adopts materials with thermal stability, such as the ceramic material aluminum oxide ($Al_2O_3$). Moreover, the reflective cup 77 can be firmly combined with the ceramic base 71 by adhesion of the insulating protective layer 73. The metallic reflective layer 74 is formed on a surface of a side of the insulating protective layer 73 facing away from the ceramic base 71, as well as an inner surface and a top surface of the reflective cup 77, which can be produced by a process such as evaporation or sputtering. The metallic reflective layer 74 is preferably an aluminum layer, because the metal aluminum has quite high reflectivity in the wave band from deep ultraviolet to infrared, generally over 95%, which can achieve a high reflection effect on all the wave band. The optical anti-reflective film 75 is disposed on a surface of a side of the metallic reflective layer 74 facing away from the insulating protective layer 73 and the reflective cup 77, which is for example formed on the surface of the metallic reflective layer 74 by a process such as evaporation or sputtering, the material of which can be magnesium fluoride, silicon dioxide, etc. The optical anti-reflective film 75 can be a monolayer structure or a multilayer structure. Moreover, it deserves to be mentioned that the metallic reflective layer 74 and the optical anti-reflective film 75 can be merely disposed on an inclined inner surface of the reflective cup 77 rather than both on the top surface and the inner surface.

It can be known that from first embodiment to the fourth embodiment, the material with high heat conductivity, superior insulation and stability is used as the base. Corresponding paths are produced on the surface or in the base. The protective layer with superior insulation and stability is produced on the surface of the paths. The surface of the protective layer is formed with the layer with high reflectivity and stability in all the wave band, even disposed with the optical anti-reflective film. The LED flip-chip package substrate with high heat conductivity, high reflectivity, stability and superior insulation can be obtained by comprehensively utilizing advantages of various materials.

Figure 9:
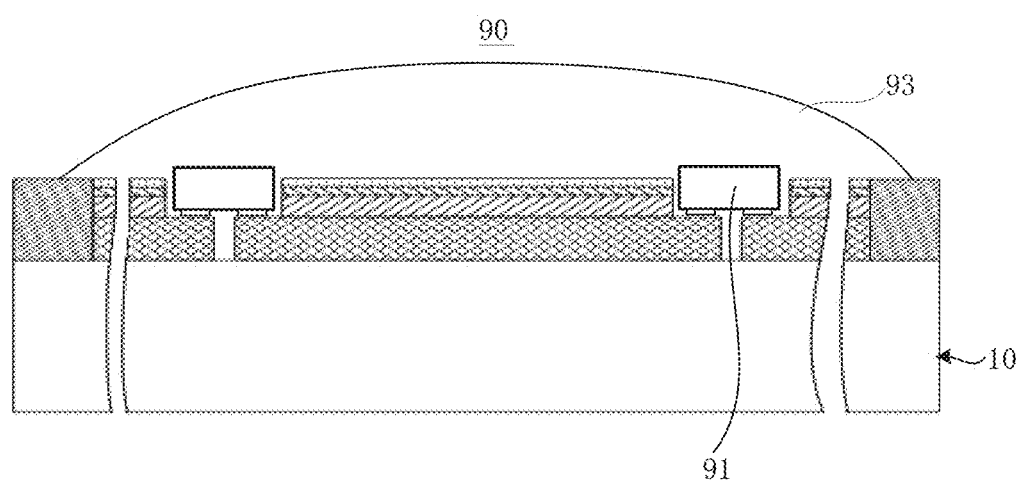
FIG. 9 is schematic view of a LED package structure adopting the LED flip-chip package substrate of the first embodiment of the disclosure.

Furthermore, referring to FIG. 9, FIG. 9 is schematic view of a LED package structure adopting the LED flip-chip package substrate 10 of the first embodiment of the disclosure. As shown in FIG. 9, a LED package structure 90 includes the LED flip-chip substrate 10, a LED chip 91 and a light-transmissive encapsulation 93. The LED chip 91 and the pads 12a, 12b of the LED flip-chip substrate 10 are electrically connected by soldering, and the light-transmissive encapsulation 93 covers the LED chip 91. Moreover, other LED package structures with the LED chip and the light-transmissive encapsulation can be obtained by utilizing the LED flip-chip package substrates 30, 50 and 70 of the second, third and fourth embodiments described above, which will not be repeated.

Furthermore, the design idea of comprehensively utilizing advantages of various materials provided by the embodiments of the disclosure can further be applied in other LED package structures, such as the chip-level packaged ultraviolet (UV) LED package structure (or the chip-level packaged UV LED light source). The UV LED package structure has huge application prospect in fields such as medical treatment, sanitation and industries due to the specificity of wavelengths of the UV LED package structure. The requirement of the market on the UV LED products are increasing rapidly, and the requirement on the models of the products is more diverse. On one hand, design of the light source can be flexible due to properties of small size and power density concentration of the chip-level packaged light source. The leadframe or the package substrate can be removed so as to obtain cost efficiency. On the other hand, as the UV LED has short wavelengths, high energy, and light penetration of the chip is difficult, especially the deep UV LED has high requirements on the package material and the package structure, a plenty of conventional package reflective material has low reflectivity on the UV wavelength. The light-transmissive material has low transmittance on the UV wave band and poor resistance to UV radiation. Which significantly increase difficulty in packaging UV LED products. The light-emitting efficiency of the light source, reliability and the service life can be affected as well. Therefore, the chip-level packaged UV LED package structure with high light extraction efficiency and reliability is required to be designed by proper structural design, material selection and processes.

Fifth Embodiment

Figure 10:
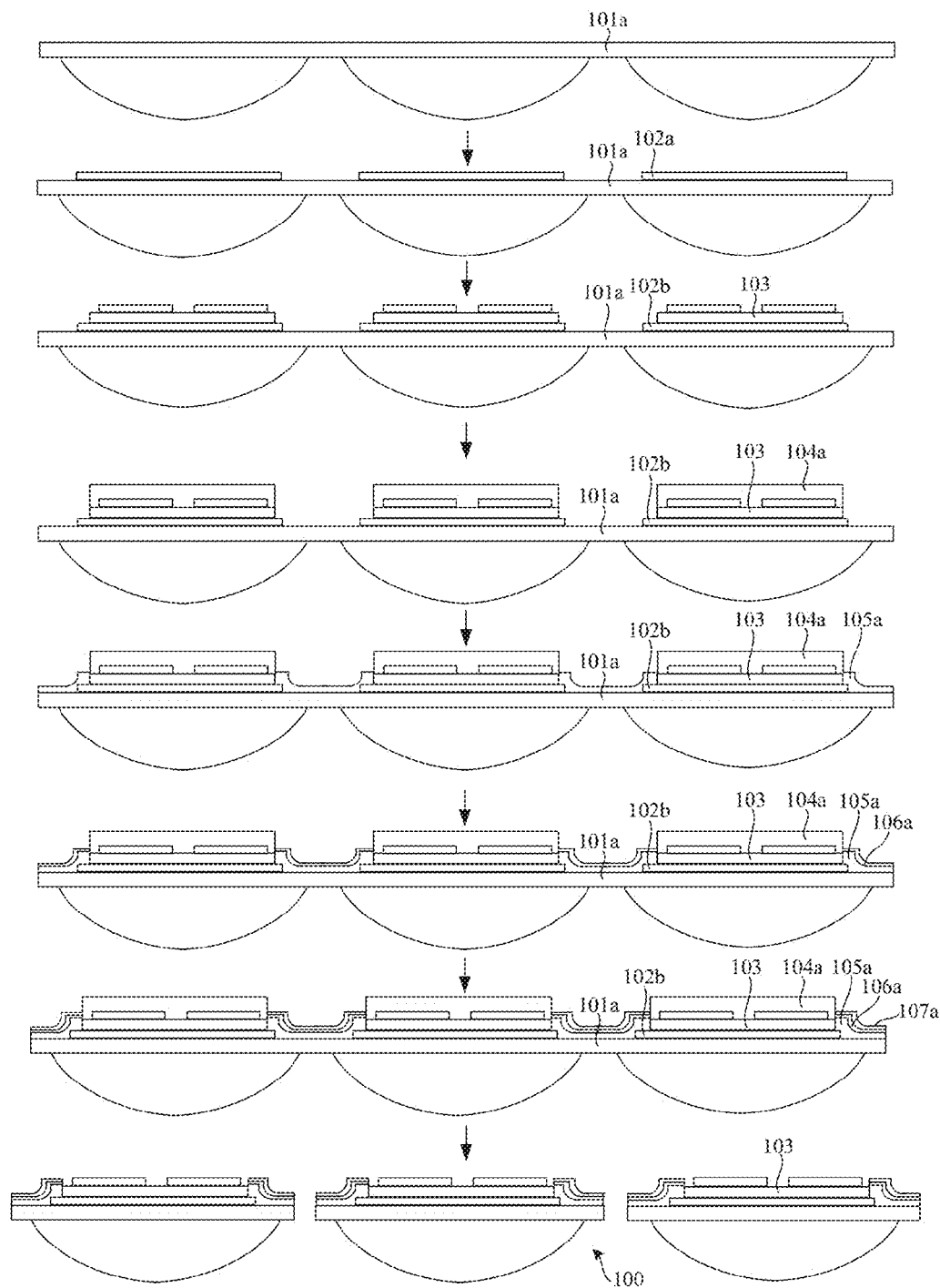
FIG. 10 is a schematic view of relative structures in a manufacturing method of a chip-level packaged ultraviolet LED package structure according to a fifth embodiment of the disclosure.

FIG. 10 is a schematic view of relative structures in a manufacturing method of a chip-level packaged ultraviolet LED package structure according to a fifth embodiment of the disclosure.

1) A quartz glass arranged as a matrix (e.g., model is JGS1 or JGS2) lens (e.g., the convex lens shown in FIG. 10) is used as a support plate 101a. Optical quartz glass such as JGS1, JGS2, etc. has high UV transmittance, and absorption of light in wave bands of 180 nm~420 nm is little, transmittance≥92%. The index of refraction thereof (1.47~1.57) and the index of refraction of the UV LED chip substrate (1.76~1.77) are similar, which can reduce the difference of indexes of refraction between the UV LED chip and air to enhance the light extraction efficiency of the UV LED chip. Lenses with various sizes and/or curvatures can be achieved according to requirements of sizes and light-emitting angles of the light source.

2) A light-transmissive layer 102a configured to fix the UV LED chip and resist UV light is formed on the support plate 101a by a process such as screen printing. The index of refraction of the light-transmissive layer 102a after corresponding processes (e.g., sintering to melt or solidification) is in a range of 1.47~1.77 and the transmittance of the UV wave band≥92%. In the embodiment, the material of the light-transmissive layer 102a can be low-temperature frit. The low-temperature glass (glass melt below 600° C. containing $SiO_2$, $B_2O_3$, $Bi_2O_3$, ZnO, $Li_2O$, $K_2O$, $Na_2O$, CaO, BaO, etc.) has properties of superior insulation, chemical stability and thermal stability of the conventional glass. The low-temperature glass is melted at relative low temperatures due to the low melting point, then cooled down to form dense and stable glass with good transparency. The LED chip and the support plate 101a can be pasted securely by viscosity of the glass liquid simultaneously. It can be other materials with the feature of resisting UV light, thermal stability, chemical stability, good adhesion, attachment, air-tightness and transparency for UV light such as resisting UV light-transmissive resin colloid or modified silicone colloid.

3) The UV LED chip 103 is attached on the light-transmissive layer 102a. The light-transmissive layer 102b can be formed by a corresponding process such as sintering to melt or solidification to firmly combine the UV LED chip and the support plate 101a.

4) A rear region (including the surface on and out of the pads) of the UV LED chip 103 is formed with a mask 104a to temporarily separate the rear region.

5) Dense and stable optical anti-reflective film 105a is formed on a side of the UV LED chip 103 and a surface of the support plate 101a on two sides of each UV LED chip 103 by such as evaporation or sputtering, the material of which is preferably $MgF_2$, $MgF_2$ has excellent transmittance in the wave band from deep UV to far infrared, thermal stability and chemical stability, which can form dense and stable insulating protective layer on the side of the UV LED chip 103 and increase permeability of rays reflected by the subsequently formed reflective layer simultaneously to enhance light extraction efficiency of the packaging structure. The material thereof can be dense materials with good transmittance (≥90%) in the entire wave band, thermal stability and chemical stability other than $MgF_2$, such as $SiO_2$, etc. The optical anti-reflective film 105a can be a monolayer structure or a multilayer (two layers or more layers) structure combined by materials with the properties above. The thickness of the monolayer structure is ¼ of a wavelength of the corresponding wave band (λ/4). If it is a multilayered structure, thicknesses of each layer are a combination of ¼ (λ/4) and ½ (λ/2) of the wavelength of the corresponding wave band. A manner of combination is determined by the number of layers and the material of the film.

6) A reflective layer 106a with high reflectivity in the UV wave band is formed on a surface of a side of the optical anti-reflective film 105a facing away from the support plate 101a by such as evaporation or sputtering, which is preferably an aluminum (Al) layer. The metal Al has quite high reflectivity (over 95%) in the wave band from deep UV to infrared, which can reflect rays from the lateral side of the UV LED chip 103 to the front surface for reducing light on the lateral side and increasing the light emission from the front surface to enhance the coefficient of utilization of light from the UV LED chip 103, as well as benefit for design of the light-emitting angle of the lens.

7) A dense protective layer 107a with highly chemical stability is formed on a surface of a side of the reflective layer 106a facing away from the optical anti-reflective film 105a by evaporation or sputtering, such as $SiO_2$, which can prevent the reflective layer 106a from being corroded or oxidized, further resulting in reflectivity reduction.

8) The mask 104a covering the rear region of the UV LED chip 103 is removed, then one chip-level packaged UV LED package structure 100 can be obtained by cutting correspondingly.

Figure 11:
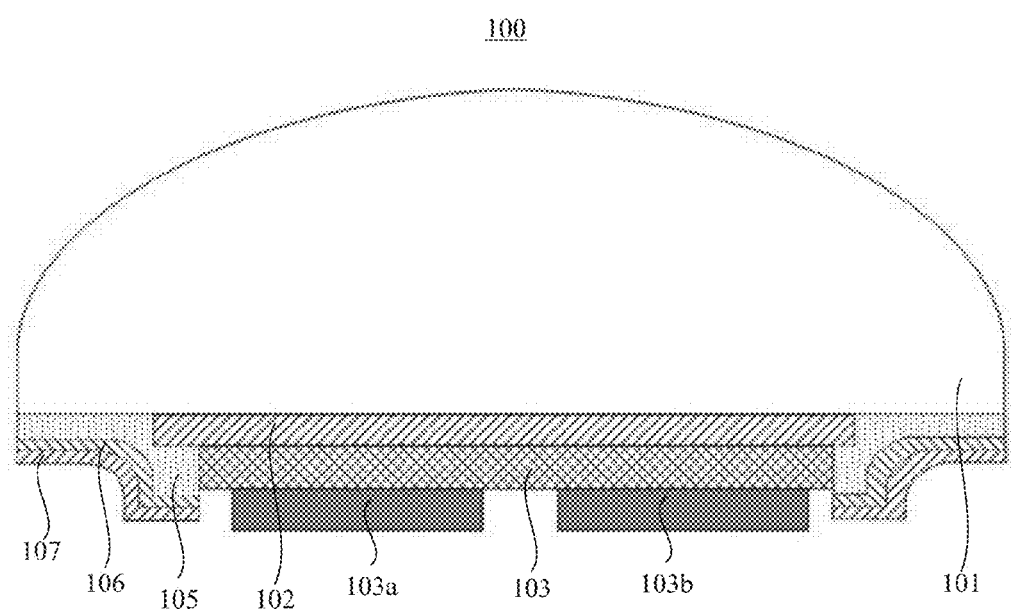
FIG. 11 is an enlarged schematic view of a cross-section of one chip-level packaged ultraviolet LED package structure in FIG. 10.
Figure 12:
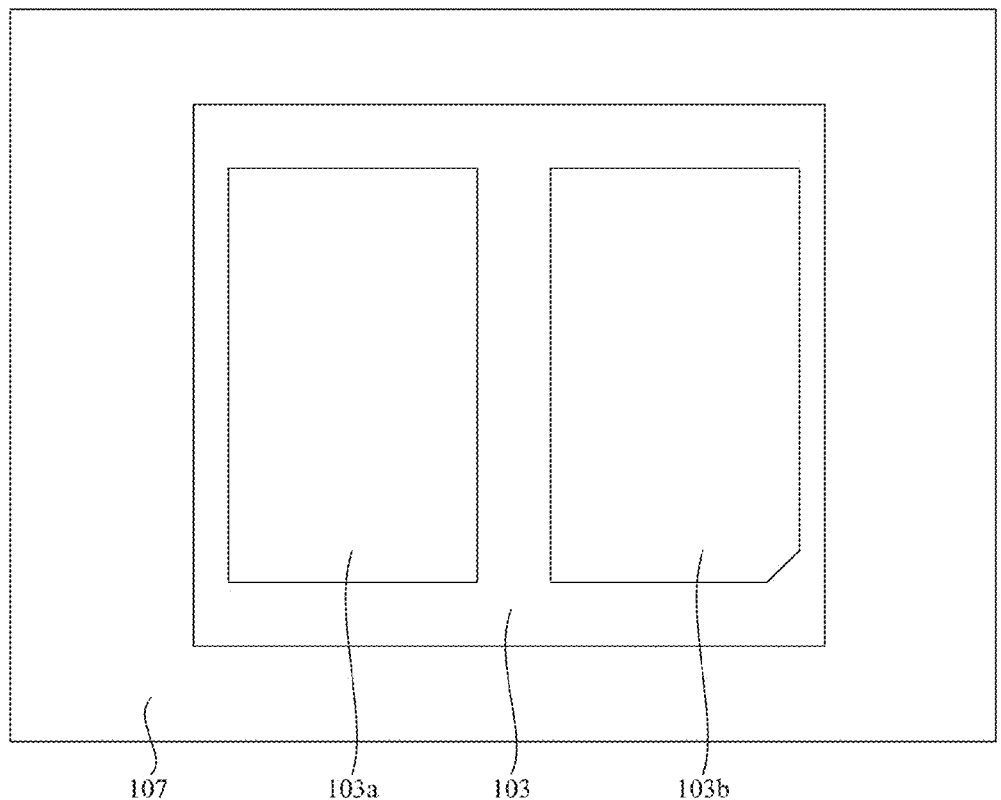
FIG. 12 is a bottom view of the chip-level packaged ultraviolet LED package structure shown in FIG. 11.

FIG. 11 is an enlarged schematic view of a cross-section of one chip-level packaged ultraviolet LED package structure 100 in FIG. 10. FIG. 12 is a bottom view of the chip-level packaged ultraviolet LED package structure 100 shown in FIG. 11. As shown in FIG. 11 and FIG. 12, the chip-level packaged UV LED package structure 100 includes the quartz glass base 101, the light-transmissive layer 102, the UV LED chip 103, the optical anti-reflective film 105, the reflective layer 106 and the protective layer 107, respectively corresponding to the support plate 101a, the light-transmissive layer 102b, the UV LED chip 103, the optical anti-reflective film 105a, the reflective layer 106a and the protective layer 107a before cutting in FIG. 10.

The quartz glass base 101 is a lens base. The light-transmissive layer 102 is disposed on a surface of a side of the quartz glass base 101, a material of which is preferably glass with a melting point lower than 600° C. or modified silicone. The UV LED chip 103 is disposed on a surface of a side of the light-transmissive layer 102 facing away from the quartz glass base 101. The quartz glass base 101 and the light-transmissive layer 102 are on the front surface of the UV LED chip 103. The rear surface of the UV LED chip 103 is formed with the pads 103a and 103b disposed in pair. The anti-reflection film 105 is disposed on a side of the UV LED chip 103 (which is a surface between the front surface and the rear surface), a surface of the light-transmissive layer 102 uncovered by the UV LED chip 103 and a surface of the quartz glass base 101 uncovered by the UV LED chip 103. The reflective layer 106 is disposed on a surface of a side of the optical anti-reflective film 105 facing away from the quartz glass base 101, and the protective layer 107 is disposed on a surface of a side of the reflective layer 106 facing away from the optical anti-reflective film 105. Moreover, it deserves to be mentioned that the protective layer 107 is an optional structure, which means the protective layer 107 can be absent in some embodiments.

Sixth Embodiment

Figure 13:
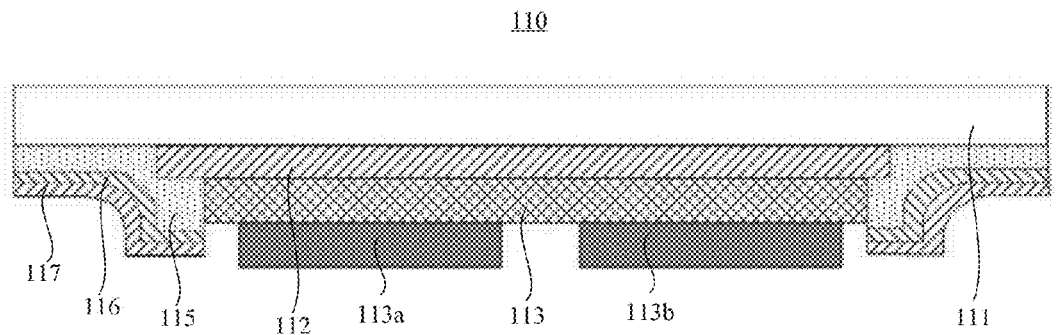
FIG. 13 is a cross-sectional schematic view of a chip-level packaged ultraviolet LED package structure according to a sixth embodiment of the disclosure.

FIG. 13 is a cross-sectional schematic view of a chip-level packaged ultraviolet LED package structure according to a sixth embodiment of the disclosure. As shown in FIG. 13, the chip-level packaged UV LED package structure 110 includes the quartz glass base 111, the light-transmissive layer 112, the UV LED chip 113, the optical anti-reflective film 115, the reflective layer 116 and the protective layer 117.

The quartz glass base 111 is a flat base, and the light-transmissive layer 112 is disposed on a surface of a side of the quartz glass base 111. The UV LED chip 113 is disposed a surface of a side of the light-transmissive layer 112 facing away from the quartz glass base 111. The quartz glass base 111 and the light-transmissive layer 112 are on the front surface of the UV LED chip 113, and the rear surface of the UV LED chip 113 is formed with the pads 113a and 113b disposed in pair. The anti-reflection film 115 is disposed on a side of the UV LED chip 113 (which is a surface between the front surface and the rear surface), a surface of the light-transmissive layer 112 uncovered by the UV LED chip 113 and a surface of the quartz glass base 111 uncovered by the UV LED chip 113. The reflective layer 116 is disposed on a surface of a side of the optical anti-reflective film 115 facing away from the quartz glass base 111, and the protective layer 117 is disposed on a surface of a side of the reflective layer 116 facing away from the optical anti-reflective film 115. In short, the difference of the sixth embodiment and the fifth embodiment of the disclosure is the quartz glass base. The quartz glass base 111 of the sixth embodiment is a flat base, and the quartz glass base 101 of the fifth embodiment is a lens base. The other components are the same. Correspondingly, the manufacturing method of the chip-level packaged UV LED package structure 110 of the sixth embodiment and the manufacturing method in the fifth embodiment shown in FIG. 10 are basically the same. The difference is that the support plate 101a formed by the quartz glass lens arranged as a matrix in FIG. 10 is replaced by the flat quartz glass. Moreover, it deserves to be mentioned that the protective layer 117 is an optional structure, which means the protective layer 107 can be absent in some embodiments.

Finally, the chip-level packaged LED package structure provided by the disclosure is not restricted to the UV LED package structure described in the fifth and sixth embodiments, which can also be a LED package structure in other wave bands.

The above description illustrates preferred embodiments of the disclosure rather than any limitation, though the preferred embodiments are disclosed previously, the disclosure needs not be limited to the disclosed embodiments. For those skilled persons in the art, various modifications and variations can be made according to the concept of the disclosure. It is intended to cover various modifications and similar arrangements included within the spirit and scope of the appended claims that are to be accorded with the broadest interpretation so as to encompass all such modifications and similar structures.

What is claimed is:
1. A LED flip-chip package substrate, comprising:
a ceramic base;
a conductive wire layer, disposed on the ceramic base and comprising pads disposed in pairs;
an insulating protective layer, disposed in direct contact with a same side of the ceramic base as the conductive wire layer and exposing the pads; wherein the insulating protective layer is a low-temperature glass glaze layer, a melting point of the low-temperature glass glaze layer is lower than 600° C.;
a reflective cup with a bowl-like structure disposed exposing the pads, wherein the reflective cup comprises a bottom surface and an inclined inner surface next to the bottom surface, the bottom surface is in direct contact with a side of the insulating protective layer facing away from the ceramic base;
a metallic reflective layer disposed exposing the pads, wherein a portion of the metallic reflective layer is disposed in direct contact with a portion of the insulating protective layer exposed from the reflective cup and on the side of the insulating protective layer facing away from the ceramic base and thereby the portion of the metallic reflective layer is combined with the ceramic base by adhesion of the insulating protective layer, another portion of the metallic reflective layer next to the portion of the metallic reflective layer is disposed in direct contact with the inclined inner surface of the reflective cup;
an optical anti-reflective film disposed in direct contact with a side of the metallic reflective layer facing away from the insulating protective layer and exposing the pads, and thereby the optical anti-reflective film covers the portion of the metallic reflective layer in direct contact with the portion of the insulating protective layer as well as covers the another portion of the metallic reflective layer in direct contact with the inclined inner surface of the reflective cup, wherein the optical anti-reflective film is configured to increase permeability of reflected rays from the metallic reflective layer.
2. The LED flip-chip package substrate according to claim 1, wherein the LED flip-chip package substrate further comprises an ink layer on the ceramic base.

3. The LED flip-chip package substrate according to claim 1, wherein a reflectivity of the metallic reflective layer in a wave band from deep ultraviolet to infrared is more than 95%.

4. The LED flip-chip package substrate according to claim 1, wherein a material of the optical anti-reflective film is at least one of magnesium fluoride and silicon dioxide, and the optical anti-reflective film is a monolayer structure or a multilayer structure, and a thickness of the monolayer structure is ¼ of a wavelength of a corresponding wave band, and thicknesses of layers in the multilayer structure are a combination of ¼ and ½ of the wavelength of the corresponding wave band.

5. The LED flip-chip package substrate according to claim 1, wherein the amount of the reflective cup is at least one, and the amount of the pads surrounded by each reflective cup is at least one pair; the insulating protective layer and the metallic reflective layer are partially disposed on the conductive wire layer.

6. A LED package structure, comprising: a LED flip-chip package substrate according to claim 1, a LED chip and a light-transmissive encapsulation; the LED chip and the pads of the LED flip-chip package substrate are fixed by soldering for electrical connection, the light-transmissive encapsulation is disposed covering the LED chip.

7. The LED package structure according to claim 6, wherein the LED flip-chip package substrate further comprises an ink layer on the ceramic base, and the light-transmissive encapsulation rises from the ink layer.

8. The LED package structure according to claim 6, wherein a reflectivity of the metallic reflective layer in a wave band from deep ultraviolet to infrared is more than 95%.

9. The LED package structure according to claim 6, wherein a material of the optical anti-reflective film is at least one of magnesium fluoride and silicon dioxide, and the optical anti-reflective film is a monolayer structure or a multilayer structure, and a thickness of the monolayer structure is ¼ of a wavelength of a corresponding wave band, and thicknesses of layers in the multilayer structure are a combination of ¼ and ½ of the wavelength of the corresponding wave band.

10. The LED flip-chip package substrate according to claim 6, wherein the amount of the reflective cup is at least one, and the amount of the pads surrounded by each reflective cup is at least one pair; the insulating protective layer and the metallic reflective layer are partially disposed on the conductive wire layer.

11. A LED package structure, comprising:
    a quartz glass base;
    a light-transmissive layer, disposed in direct contact with a side of the quartz glass base; wherein a material of the light-transmissive layer is a glass with a melting point lower than 600° C. or a modified silicone resin;
    a LED chip, disposed in direct contact with a side of the light-transmissive layer facing away from the quartz glass base, wherein the quartz glass base and the light-transmissive layer are located on a front surface of the LED chip, and a rear surface of the LED chip is formed with pads disposed in pairs, the LED chip and the quartz glass base are combined together by the light-transmissive layer;
    an optical anti-reflective film, disposed in direct contact with a side surface of the LED chip, a surface of the light-transmissive layer uncovered by the LED chip and a surface of the quartz glass base uncovered by the LED chip; and
    a metal reflective layer, disposed on a side of the optical anti-reflective film facing away from the quartz glass base and electrically insulated from both the pads of the LED chip;
    wherein the optical anti-reflective film is a monolayer structure or a multilayer structure, a thickness of the monolayer structure is ¼ of a wavelength of a corresponding wave band, and thicknesses of layers of the multilayer structure are a combination of ¼ and ½ of the wavelength of the corresponding wave band.

12. The LED package structure according to claim 11, wherein the LED package structure further comprises:
    a protective layer, disposed on a side of the reflective layer facing away from the optical anti-reflective film.

13. The LED package structure according to claim 11, wherein a material of the optical anti-reflective film is magnesium fluoride or silicon dioxide, and the metal reflective layer is a metal aluminum layer.

14. The LED package structure according to claim 11, wherein the quartz glass base is a lens base.

* * * * *